United States Patent
Jeong

(10) Patent No.: US 7,379,353 B2
(45) Date of Patent: *May 27, 2008

(54) VOLTAGE PUMPING DEVICE

(75) Inventor: Bong Hwa Jeong, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/743,242

(22) Filed: May 2, 2007

(65) Prior Publication Data

US 2007/0201285 A1 Aug. 30, 2007

Related U.S. Application Data

(63) Continuation of application No. 11/275,461, filed on Jan. 6, 2006, now Pat. No. 7,230,860.

(30) Foreign Application Priority Data

Jun. 29, 2005 (KR) ............... 2005-57356

(51) Int. Cl.
*G11C 7/00* (2006.01)
(52) U.S. Cl. .................. 365/189.09; 327/534
(58) Field of Classification Search ........ 365/189.09, 365/222; 327/534, 535, 536
See application file for complete search history.

(56) References Cited

U.S. PATENT DOCUMENTS

| 5,673,232 | A | 9/1997 | Furutani |
|---|---|---|---|
| 5,886,932 | A | 3/1999 | Choi |
| 6,232,830 | B1 | 5/2001 | Fournel |
| 6,411,157 | B1 | 6/2002 | Hsu et al. |
| 6,545,929 | B1 * | 4/2003 | Huber .................. 365/226 |
| 6,960,949 | B2 | 11/2005 | Suzuki |
| 6,970,035 | B2 | 11/2005 | Tanimoto |
| 6,975,161 | B2 | 12/2005 | Yen |
| 7,230,860 | B2 | 1/2007 | Jeong |

FOREIGN PATENT DOCUMENTS

KR  10-1999-0081305  11/1999

* cited by examiner

*Primary Examiner*—Vu A Le
(74) *Attorney, Agent, or Firm*—Marshall, Gerstein & Borun LLP

(57) ABSTRACT

A voltage pumping device is disclosed. The device comprises a reference voltage generator for generating a reference voltage having different levels depending on whether a semiconductor device is in a self-refresh mode or not, a voltage level detector for outputting a voltage pumping enabling signal in response to the reference voltage and a specific voltage fed back thereto, a voltage pump for performing a voltage pumping operation in response to the voltage pumping enabling signal to output the specific voltage, a discharge controller for outputting a discharge control signal in response to the reference voltage and the specific voltage, and a discharge circuit for discharging an output terminal of the voltage pump to a desired voltage level in response to the discharge control signal.

20 Claims, 6 Drawing Sheets

VOLTAGE PUMPING DEVICE

FIELD OF THE INVENTION

This patent is a continuation of U.S. Ser. No. 11/275,461 filed Jan. 6, 2006, now U.S. Pat. No. 7,230,860 the disclosure of which is hereby expressly incorporated for all purposes.

This patent relates to a voltage pumping device of a semiconductor memory device, and more particularly to a voltage pumping device of a semiconductor device for generating a back bias voltage of a higher level in a self-refresh mode.

DESCRIPTION OF THE RELATED ART

Generally, in a semiconductor device, a voltage pumping device is used to apply a back bias voltage VBB to a desired part of the semiconductor device, particularly a cell transistor. Here, the back bias voltage VBB is a negative voltage which is used for a well bias of a memory core area and generated by pumping an external voltage VDD negatively.

Recently, various efforts have been made to reduce current consumption in a semiconductor device and, particularly, various studies are in progress to reduce current consumption in the self-refresh mode of a dynamic random access memory (DRAM). Current consumed to store data in a memory cell in the self-refresh mode is measured for self-refresh time and the measured current is self-refresh current. In order to reduce this self-refresh current, it is necessary to increase the self-refresh period. Furthermore, in order to increase the self-refresh period, it is necessary to increase the data retention time for which the data is retained in the memory cell. One approach to increasing the data retention time is to increase a back bias voltage that is applied to a transistor of the memory cell. In this case, a back bias voltage VBB pumped and outputted from a voltage pumping device is raised and supplied in the self-refresh mode. As a result, off leakage current of the cell transistor is reduced, resulting in an increase in the data retention time.

In this case, however, such a conventional voltage pumping device has to wait until the back bias voltage VBB rises due to natural current leakage therein, thereby causing a long delay until the back bias voltage VBB rises to a desired level. For this reason, the data retention time is short with respect to data refreshed at the beginning of the self-refresh mode, thus deteriorating refresh characteristics of the semiconductor device and causing an error therein.

This problem with the conventional voltage pumping device will hereinafter be described in detail with reference to FIG. 1, which shows the configuration of the conventional voltage pumping device.

In FIG. 1, first, a reference voltage generator 110 generates a reference voltage VREF of a desired level and supplies it to a voltage level detector 120. Then, the voltage level detector 120 detects the level of a back bias voltage VBB from a voltage pump 130, fed back thereto, and generates a voltage pumping enabling signal ppe based on the detected level. Here, the voltage level detector 120 determines whether the voltage VBB from the voltage pump 130 is higher than a certain voltage set according to the reference voltage VREF. If the voltage VBB is higher than the set voltage, the voltage level detector 120 enables the voltage pumping enabling signal ppe such that the voltage pump 130 performs a voltage pumping operation. On the contrary, if the voltage VBB is lower than the set voltage, the voltage level detector 120 disables the voltage pumping enabling signal ppe such that the voltage pump 130 stops the voltage pumping operation. Finally, the voltage pump 130 performs the voltage pumping operation in response to the voltage pumping enabling signal ppe from the voltage level detector 120 to pump the back bias voltage VBB to a desired level.

Notably, if the semiconductor device enters the self-refresh mode, the reference voltage generator 110 outputs the reference voltage VREF of a higher level than that before the semiconductor device enters the self-refresh mode, in order to raise the back bias voltage VBB. As a result, the specific voltage, which is a reference for the pumping operation of the voltage pump 130, rises and the back bias voltage VBB from the voltage pump 130 thus rises.

However, the conventional voltage pumping device has a disadvantage in that the back bias voltage VBB cannot rise rapidly at the beginning of the self-refresh mode. That is, because the conventional voltage pumping device has no separate means for raising the low back bias voltage VBB, it must wait until the back bias voltage VBB rises due to the natural current leakage therein. For this reason, in the conventional voltage pumping device, there is a slight delay before the back bias voltage VBB rises to the desired level. Consequently, the data retention time is short with respect to data refreshed at the beginning of the self-refresh mode, thereby deteriorating refresh characteristics of the semiconductor device and causing a data error therein.

SUMMARY OF THE INVENTION

A voltage pumping device is capable of generating a back bias voltage of a higher level in a self-refresh mode and, when a semiconductor device enters the self-refresh mode, discharging an output terminal of the voltage pumping device to a desired voltage level, such as a ground level, so as to rapidly raise the back bias voltage, thereby improving self-refresh characteristics of the semiconductor device.

A voltage pumping device may perform a voltage pumping operation to pump and output a specific voltage having different levels depending on whether a semiconductor device is in a self-refresh mode or not. The voltage pumping device may include a discharge controller for outputting a discharge control signal in response to a predetermined reference voltage and the specific voltage; and a discharge circuit for discharging an output terminal of the voltage pumping device to a desired voltage level in response to the discharge control signal.

Preferably, the voltage pumping device performs the voltage pumping operation in response to a control signal which is enabled when the semiconductor device enters the self-refresh mode, and outputs, in the self-refresh mode, the specific voltage of a higher level than that in a non-self-refresh mode.

Preferably, the discharge controller enables the discharge control signal when the specific voltage is lower than the specific voltage set according to the reference voltage in the self-refresh mode.

Preferably, the discharge controller includes: a first pull-up device for pulling a first node up to the level of the reference voltage; a first pull-down device for pulling the first node down in response to the specific voltage; and an inverter for inverting a signal at the first node and outputting the inverted signal to a second node.

Preferably, the inverter includes: a second pull-up device for pulling the second node up in response to the signal at the first node; and a second pull-down device for pulling the second node down in response to the signal at the first node.

The first pull-up device may be operated in response to a signal of a ground level.

The first pull-down device may be a PMOS transistor.

Preferably, the discharge circuit includes a MOS transistor for discharging the output terminal of the voltage pumping device in response to the discharge control signal.

The specific voltage may be a back bias voltage.

A voltage pumping device may include a reference voltage generator for generating a reference voltage having different levels depending on whether a semiconductor device is in a self-refresh mode or not; a voltage level detector for outputting a voltage pumping enabling signal in response to the reference voltage and a specific voltage fed back thereto; a voltage pump for performing a voltage pumping operation in response to the voltage pumping enabling signal to output the specific voltage; a discharge controller for outputting a discharge control signal in response to the reference voltage and the specific voltage; and a discharge circuit for discharging an output terminal of the voltage pump to a desired voltage level in response to the discharge control signal.

Preferably, the reference voltage generator is operated in response to a control signal which is enabled when the semiconductor device enters the self-refresh mode, and is adapted to output, in the self-refresh mode, the specific voltage of a higher level than that in a non-self-refresh mode.

Preferably, the reference voltage generator includes: a pull-up device for pulling an output node of the reference voltage generator up in response to the control signal; a first resistor connected between an input node of the pull-up device and an output node thereof; and a diode disposed between the output node of the reference voltage generator and a ground terminal.

The reference voltage generator may further include: a second resistor disposed between the pull-up device and the output node of the reference voltage generator; and a third resistor disposed between the diode and the ground terminal.

The diode may be an NMOS diode.

Preferably, the discharge controller enables the discharge control signal when the specific voltage is lower than a certain voltage set according to the reference voltage in the self-refresh mode.

Preferably, the discharge controller includes: a first pull-up device for pulling a first node up to a level of the reference voltage; a first pull-down device for pulling the first node down in response to the specific voltage; and an inverter for inverting a signal at the first node and outputting the inverted signal to a second node.

Preferably, the inverter includes: a second pull-up device for pulling the second node up in response to the signal at the first node; and a second pull-down device for pulling the second node down in response to the signal at the first node.

The first pull-up device may be operated in response to a signal of a ground level.

The discharge controller may further include a buffer for buffering a signal at the second node.

The first pull-down device may be a PMOS transistor.

Preferably, the discharge circuit includes a MOS transistor for discharging the output terminal of the voltage pump in response to the discharge control signal.

The specific voltage may be a back bias voltage.

A voltage pumping device may include a first reference voltage generator for generating a first reference voltage having different levels depending on whether a semiconductor device is in a self-refresh mode or not; a voltage level detector for outputting a voltage pumping enabling signal in response to the first reference voltage and a specific voltage fed back thereto; a voltage pump for performing a voltage pumping operation in response to the voltage pumping enabling signal to output the specific voltage; a second reference voltage generator for generating a second reference voltage which is enabled in the self-refresh mode; a discharge controller for outputting a discharge control signal in response to the second reference voltage and the specific voltage; and a discharge circuit for discharging an output terminal of the voltage pump to a desired voltage level in response to the discharge control signal.

Preferably, the second reference voltage generator is operated in response to a control signal which is enabled at the time that the semiconductor device enters the self-refresh mode.

Preferably, the second reference voltage generator includes: a pull-up device for pulling an output node of the second reference voltage generator up in response to the control signal; and a diode disposed between the output node of the second reference voltage generator and a ground terminal.

The second reference voltage generator may further include: a first resistor disposed between the pull-up device and the output node of the second reference voltage generator; and a second resistor disposed between the diode and the ground terminal.

Preferably, the discharge controller enables the discharge control signal when the specific voltage is lower than a certain voltage set according to the second reference voltage in the self-refresh mode.

Preferably, the discharge controller includes: a first pull-up device for pulling a first node up to a level of the second reference voltage; a first pull-down device for pulling the first node down in response to the specific voltage; and an inverter for inverting a signal at the first node and outputting the inverted signal to a second node.

Preferably, the inverter includes: a second pull-up device for pulling the second node up in response to the signal at the first node; and a second pull-down device for pulling the second node down in response to the signal at the first node.

The first pull-up device may be operated in response to the signal of a ground level.

The discharge controller may further include a buffer for buffering a signal at the second node.

The first pull-down device may be a PMOS transistor.

Preferably, the discharge circuit includes a MOS transistor for discharging the output terminal of the voltage pump in response to the discharge control signal.

The specific voltage may be a back bias voltage.

A voltage pumping device may include a reference voltage generator for generating a reference voltage having different levels depending on whether a semiconductor device is in a self-refresh mode or not; a voltage level detector for outputting a voltage pumping enabling signal in response to the reference voltage and a specific voltage fed back thereto; a voltage pump for performing a voltage pumping operation in response to the voltage pumping enabling signal to output the specific voltage; a signal generator for outputting a discharge control signal which is enabled in a predetermined period in the self-refresh mode; and a discharge circuit for discharging an output terminal of the voltage pump to a desired voltage level in response to the discharge control signal.

Preferably, the reference voltage generator is operated in response to a control signal which is enabled at the time that the semiconductor device enters the self-refresh mode, and is adapted to output, in the self-refresh mode, the specific voltage of a higher level than that in a non-self-refresh mode.

Preferably, the reference voltage generator includes: a pull-up device for pulling an output node of the reference voltage generator up in response to the control signal; a resistor connected between an input node of the pull-up device and an output node thereof; and a diode disposed between the output node of the reference voltage generator and a ground terminal.

Preferably, the signal generator includes: a delay for delaying a control signal by the predetermined period, the control signal being enabled at the time that the semiconductor device enters the self-refresh mode; a buffer for buffering an output signal from the delay; and a logic unit for performing a logic operation with respect to the output signal from the buffer and the control signal.

The buffer may be an inverting buffer.

The logic unit may perform an AND operation.

Preferably, the discharge circuit includes a MOS transistor for discharging the output terminal of the voltage pump in response to the discharge control signal.

The specific voltage may be a back bias voltage.

BRIEF DESCRIPTION OF THE DRAWINGS

Various features and advantages of the present invention will be more clearly understood from the following detailed description taken in conjunction with the accompanying drawings, in which.

DESCRIPTION OF THE PREFERRED EMBODIMENTS

Figure 1:
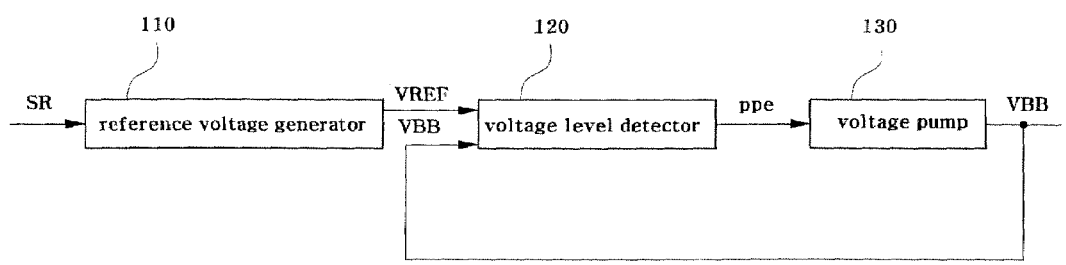
FIG. 1 is a block diagram showing the configuration of a conventional voltage pumping device.

Reference will now be made in detail to the preferred embodiments of the present invention, examples of which are illustrated in the accompanying drawings, wherein like reference numerals refer to like elements throughout. The embodiments are described below to explain the present invention by referring to the figures.

Figure 2:
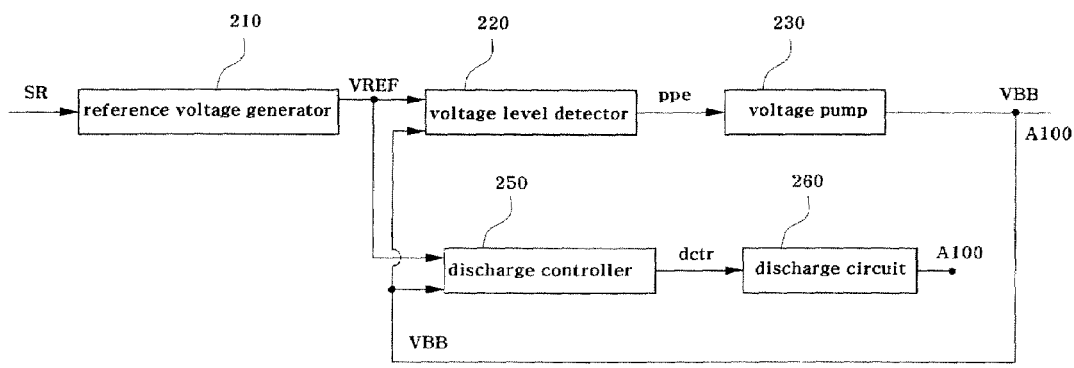
FIG. 2 is a block diagram showing the configuration of a voltage pumping device according to a first embodiment of the present invention.

With reference to FIG. 2, there is shown in block form the configuration of a voltage pumping device according to a first embodiment of the present invention.

As shown in FIG. 2, the voltage pumping device according to the first embodiment comprises a reference voltage generator 210 for generating a reference voltage VREF having different levels depending on whether a semiconductor device is in a self-refresh mode or not, a voltage level detector 220 for outputting a voltage pumping enabling signal ppe in response to the reference voltage VREF and a back bias voltage VBB fed back thereto, a voltage pump 230 for performing a voltage pumping operation in response to the voltage pumping enabling signal ppe to output the back bias voltage VBB, a discharge controller 250 for outputting a discharge control signal dctr in response to the reference voltage VREF and the back bias voltage VBB, and a discharge circuit 260 for discharging an output terminal of the voltage pump 230 to a desired voltage level in response to the discharge control signal dctr.

Here, the reference voltage generator 210 is operated in response to a control signal SR which is enabled at the time that the semiconductor device enters the self-refresh mode, and is adapted to output, in the self-refresh mode, the reference voltage VREF of a higher level than that in a non-self-refresh mode. The discharge controller 250 acts to enable the discharge control signal dctr when the back bias voltage VBB is lower than a certain voltage set according to the reference voltage VREF in the self-refresh mode.

The operation of the voltage pumping device with the above-stated configuration according to the first embodiment will hereinafter be described in detail with reference to FIGS. 2 to 6.

The voltage pumping device according to the first embodiment has different operating mechanisms depending on whether the semiconductor device is in the self-refresh mode or not, and the operation thereof will thus be described in conjunction with respective operation modes.

First, a description will be given of the operation of the voltage pumping device in a state before the semiconductor device enters the self-refresh mode. In the state before the semiconductor device enters the self-refresh mode, the control signal SR is inputted to the reference voltage generator 210 under the condition that it is disabled to a low level. Here, a self-refresh flag signal FLAG which is enabled at the time that the semiconductor device enters the self-refresh mode is used as the control signal SR. Alternatively, any other signal which is enabled at the time that the semiconductor device enters the self-refresh mode may be used as the control signal SR.

Figure 3:
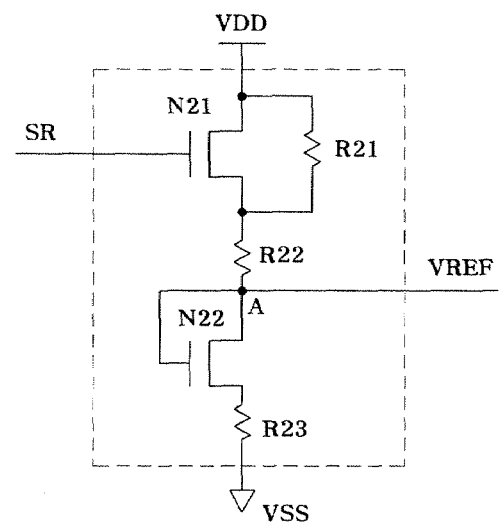
FIG. 3 is a circuit diagram of a reference voltage generator in the voltage pumping device according to the first embodiment.
Figure 4:
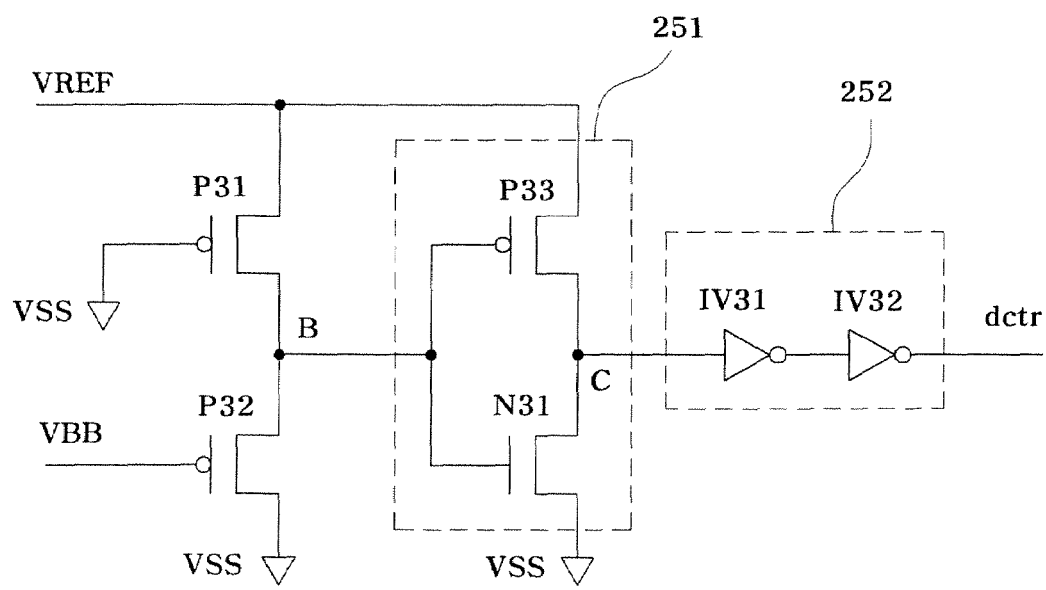
FIG. 4 is a circuit diagram of a discharge controller in the voltage pumping device according to the first embodiment.

When the inputted control signal SR is at a low level, the reference voltage generator 210 outputs the reference voltage VREF of a lower level in response to the inputted control signal SR. That is, as shown in FIG. 3, when the inputted control signal SR assumes a low level, an NMOS transistor N21 is turned off, thereby causing a node A to have a voltage obtained by dividing an external voltage VDD by a resistor R21, a resistor R22, an NMOS transistor N22 and a resistor R23. As a result, the reference voltage VREF from the reference voltage generator 210 has a lower level due to the voltage division.

Then, the voltage level detector 220 generates the voltage pumping enabling signal ppe in response to the reference voltage VREF and the back bias voltage VBB fed back from the voltage pump 230. Here, the voltage level detector 220 determines whether the back bias voltage VBB from the voltage pump 230 is higher than a first level set according to the reference voltage VREF. If the back bias voltage VBB is higher than the first level, the voltage level detector 220 enables the voltage pumping enabling signal ppe such that the voltage pump 230 performs the voltage pumping operation. On the contrary, if the back bias voltage VBB is lower than the first level, the voltage level detector 220 disables the voltage pumping enabling signal ppe such that the voltage pump 230 stops the voltage pumping operation.

Then, the voltage pump 230 performs the voltage pumping operation in response to the voltage pumping enabling signal ppe from the voltage level detector 220 to pump the back bias voltage VBB to a desired level. That is, when the voltage pumping enabling signal ppe from the voltage level detector 220 is applied to the voltage pump 230 under the condition that it is enabled, the voltage pump 230 performs the voltage pumping operation to lower the back bias voltage VBB to the first level. On the contrary, when the voltage pumping enabling signal ppe from the voltage level detector 220 is applied to the voltage pump 230 under the condition that it is disabled, the voltage pump 230 stops the voltage pumping operation. By repeating the above operation in this manner, the voltage pump 230 maintains the back bias voltage VBB at the first level.

Therefore, in the state before the semiconductor device enters the self-refresh mode, the voltage pumping device according to the first embodiment pumps and supplies the back bias voltage VBB of the lower level, or the first level, using the reference voltage VREF of the lower level from the reference voltage generator 210.

Next, a description will be given of the operation of the voltage pumping device in the in the case where the semiconductor device enters the self-refresh mode. When the semiconductor device enters the self-refresh mode, the control signal SR is inputted to the reference voltage generator 210 under the condition that it is enabled to a high level.

The reference voltage generator 210 outputs the reference voltage VREF of a higher level in response to the high-level control signal SR. That is, as shown in FIG. 3, when the inputted control signal SR assumes a high level, the NMOS transistor N21 is turned on. At this time, because the NMOS transistor N21 has a turn-on resistance much smaller than the resistance of the resistor R21, the voltage of the node A becomes higher than that resulting from the voltage division based on the resistor R21. Thus, the reference voltage VREF from the reference voltage generator 210 in the self-refresh mode has a higher level than that before the entry into the self-refresh mode, which is substantially equal to the level of a threshold voltage Vt of the NMOS transistor N22.

Then, the voltage level detector 220 generates the voltage pumping enabling signal ppe in response to the reference voltage VREF and the back bias voltage VBB fed back from the voltage pump 230. Then, the voltage pump 230 performs the voltage pumping operation in response to the voltage pumping enabling signal ppe from the voltage level detector 220 to pump the back bias voltage VBB to a desired level. At this time, the voltage level detector 220 detects the level of the back bias voltage VBB using the reference voltage VREF of the higher level. As a result, the back bias voltage VBB from the voltage pump 230 rises to a higher level than that before the entry into the self-refresh mode, namely, a second level.

Conventionally, when the back bias voltage VBB rises to the second level in the self-refresh mode in the above manner, it rises very slowly at the beginning of the self-refresh mode, thereby deteriorating refresh characteristics of the semiconductor device and causing a data error therein. In contrast, according to the first embodiment, the discharge controller 250 and the discharge circuit 260 cooperate to overcome such a problem, as will hereinafter be described in detail.

In the self-refresh mode, if the reference voltage generator 210 outputs the reference voltage VREF of the higher level, the discharge controller 250 receives the back bias voltage VBB together with the reference voltage VREF. First, in FIG. 4, because the reference voltage VREF is substantially equal to the threshold voltage Vt of the NMOS transistor N22 as stated previously and a PMOS transistor P31 receives a ground voltage VSS at its gate, the PMOS transistor P31 is neither fully turned on nor turned off, but properly turned on.

At this time, if the absolute value of a gate-source voltage Vgs of a PMOS transistor P32 becomes larger than the absolute value of a threshold voltage of the PMOS transistor P32 as the back bias voltage VBB becomes lower than the second level, the PMOS transistor P32 is turned on to a stronger current level than the PMOS transistor P31, thereby causing a larger amount of current to flow through the PMOS transistor P32. Accordingly, the voltage of a node B falls, so that a PMOS transistor P33 is turned on, thereby causing a signal at a node C to become high in level. Then, a buffer 252, which is composed of an inverter IV31 and an inverter IV32, buffers the signal at the node C and outputs the buffered signal as the discharge control signal dctr which is at a high level.

Figure 5:
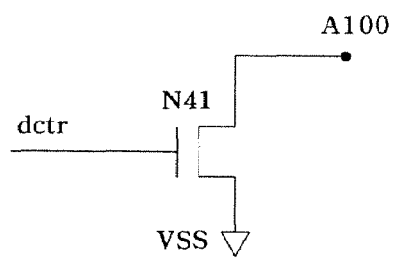
FIG. 5 is a circuit diagram of an embodiment of a discharge circuit in the voltage pumping device according to the first embodiment.

Thereafter, the high-level discharge control signal dctr turns on an NMOS transistor N41 of the discharge circuit 260 shown in FIG. 5, so as to pull a node A100 down to a ground level. As a result, the output terminal of the voltage pump 230, connected to the node A100, is discharged to the ground level. Therefore, according to the first embodiment, the back bias voltage VBB from the voltage pump 230 can rapidly rise to the second level by compulsorily discharging the output terminal of the voltage pump 230 as stated above, without waiting until the back bias voltage VBB rises due to natural current leakage in the voltage pumping device.

On the other hand, if the absolute value of the gate-source voltage Vgs of the PMOS transistor P32 becomes smaller than the absolute value of the threshold voltage of the PMOS transistor P32 as the back bias voltage VBB becomes higher than the second level, the PMOS transistor P32 is turned on more weakly than the PMOS transistor P31, thereby causing a smaller amount of current to flow through the PMOS transistor P32. As a result, the voltage of the node B rises, so that an NMOS transistor N31 is turned on, thereby causing the signal at the node C to become low in level. Then, the buffer 252 buffers the signal at the node C and outputs the buffered signal as the discharge control signal dctr which is at a low level. Thereafter, the low-level discharge control signal dctr turns off the NMOS transistor N41 of the discharge circuit 260 shown in FIG. 5, so as to stop the discharge of the output terminal of the voltage pump 230.

Figure 6:
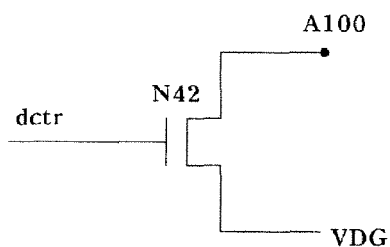
FIG. 6 is a circuit diagram of an alternative embodiment of the discharge circuit in the voltage pumping device according to the first embodiment.

Meanwhile, although the output terminal of the voltage pump 230 has been described to be discharged to the ground level as shown in FIG. 5, it may be discharged to a desired arbitrary level VDG through the use of a discharge circuit shown in FIG. 6.

As described above, the voltage pumping device according to the first embodiment is capable of generating the back bias voltage VBB of the higher level in the self-refresh mode and, when the semiconductor device enters the self-refresh mode, discharging the output terminal of the voltage pump 230 to the desired voltage level, such as the ground level, so as to rapidly raise the back bias voltage to the desired level, or the higher level. Therefore, it is possible to improve the self-refresh characteristics of the semiconductor device.

Figure 7:
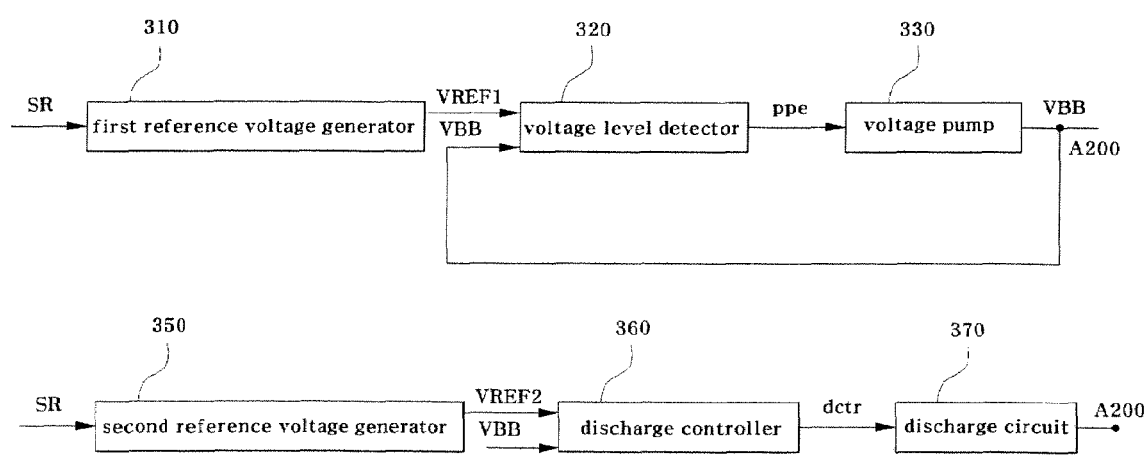
FIG. 7 is a block diagram showing the configuration of a voltage pumping device according to a second embodiment of the present invention.

FIG. 7 shows the configuration of a voltage pumping device according to a second embodiment of the present invention. A description will hereinafter be given of the voltage pumping device according to the second embodiment of the present invention with reference to FIG. 7.

As shown in FIG. 7, the voltage pumping device according to the second embodiment comprises a first reference voltage generator 310 for generating a first reference voltage VREF1 having different levels depending on whether a semiconductor device is in a self-refresh mode or not, a voltage level detector 320 for outputting a voltage pumping enabling signal ppe in response to the first reference voltage VREF1 and a back bias voltage VBB fed back thereto, a voltage pump 330 for performing a voltage pumping operation in response to the voltage pumping enabling signal ppe to output the back bias voltage VBB, a second reference voltage generator 350 for generating a second reference voltage VREF2 which is enabled in the self-refresh mode, a discharge controller 360 for outputting a discharge control signal dctr in response to the second reference voltage VREF2 and the back bias voltage VBB, and a discharge circuit 370 for discharging an output terminal of the voltage pump 330 to a desired voltage level in response to the discharge control signal dctr.

Here, the second reference voltage generator 350 is operated in response to a control signal SR which is enabled when the semiconductor device enters the self-refresh mode. The discharge controller 360 acts to enable the discharge control signal dctr when the back bias voltage VBB is lower than a certain voltage set according to the second reference voltage VREF2 in the self-refresh mode.

The operation of the voltage pumping device with the above-stated configuration according to the second embodiment will hereinafter be described in detail with reference to FIGS. 7 to 11.

The voltage pumping device according to the second embodiment has different operating mechanisms depending on whether the semiconductor device is in the self-refresh mode or not, and the operation thereof will thus be described in conjunction with respective operation modes.

First, a description will be given of the operation of the voltage pumping device in a state before the semiconductor device enters the self-refresh mode. In the state before the semiconductor device enters the self-refresh mode, the control signal SR is inputted to the first reference voltage generator 310 under the condition that it is disabled to a low level. Here, the control signal SR is the same as that in the first embodiment.

When the inputted control signal SR is at a low level, the first reference voltage generator 310 outputs the first reference voltage VREF1 of a lower level in response to the inputted control signal SR. That is, in the first reference voltage generator 310 shown in FIG. 8, when the inputted control signal SR assumes a low level, an NMOS transistor N51 is turned off, thereby causing a node D to have a voltage obtained by dividing an external voltage VDD by a resistor R51, a resistor R52, an NMOS transistor N52 and a resistor R53. As a result, the first reference voltage VREF1 from the first reference voltage generator 310 has a lower level due to the voltage division.

Then, the voltage level detector 320 generates the voltage pumping enabling signal ppe in response to the first reference voltage VREF1 and the back bias voltage VBB fed back from the voltage pump 330. The voltage pump 330 performs the voltage pumping operation in response to the voltage pumping enabling signal ppe from the voltage level detector 320 to pump the back bias voltage VBB to a lower level, or a first level. Here, the voltage level detector 320 and the voltage pump 330 cooperate to maintain the back bias voltage VBB at the first level in the same manner as the voltage level detector 220 and the voltage pump 230 in the first embodiment.

Figure 9:
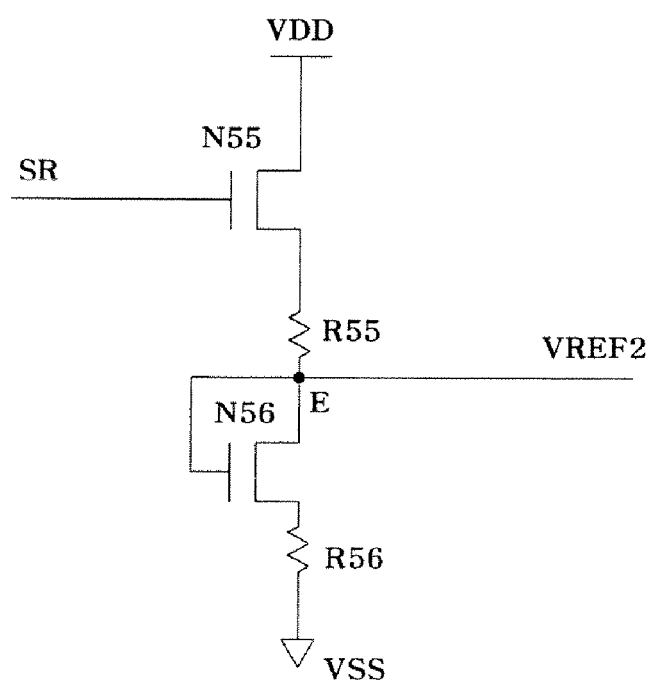
FIG. 9 is a circuit diagram of a second reference voltage generator in the voltage pumping device according to the second embodiment.

Meanwhile, when the inputted control signal SR is low in level, the second reference voltage generator 350 outputs the second reference voltage VREF2 of a ground level in response to the inputted control signal SR. That is, as shown in FIG. 9, when the inputted control signal SR assumes a low level, an NMOS transistor N55 is turned off, so that the voltage of a node E has the ground level.

Figure 10:
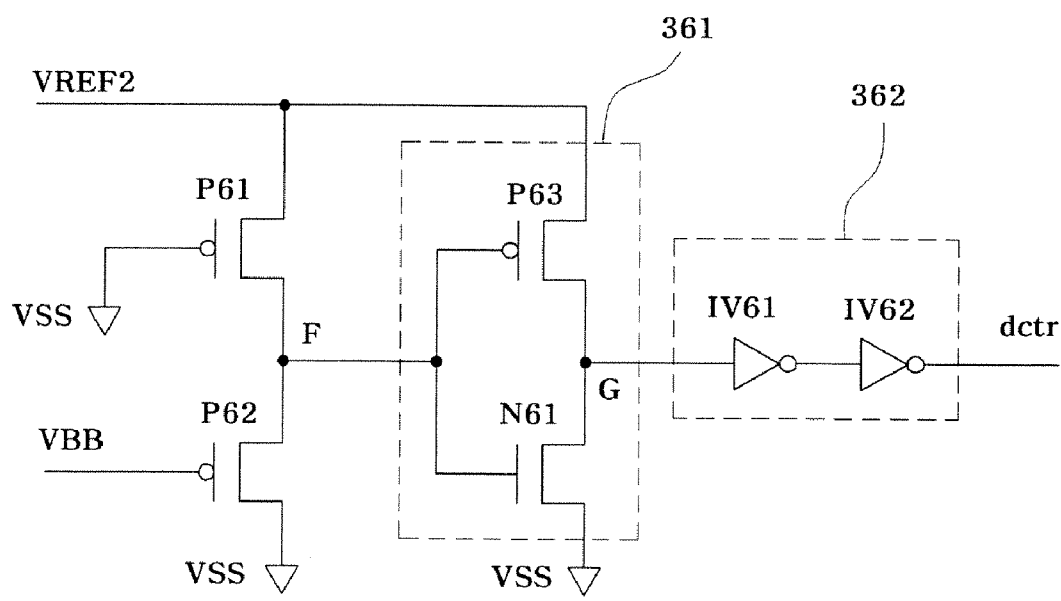
FIG. 10 is a circuit diagram of a discharge controller in the voltage pumping device according to the second embodiment.
Figure 11:
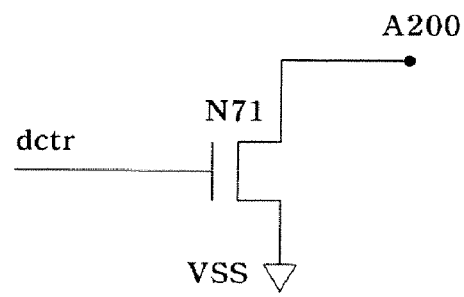
FIG. 11 is a circuit diagram of a discharge circuit in the voltage pumping device according to the second embodiment.

Then, the discharge controller 360 receives the second reference voltage VREF2 of the ground level from the second reference voltage generator 350. The configuration of the discharge controller 360 shown in FIG. 10 is the same as that of the discharge controller 250 in the first embodiment, with the exception that the second reference voltage VREF2 is inputted instead of the reference voltage VREF. The discharge controller 360 receives the second reference voltage VREF2 of the ground level and outputs the discharge control signal dctr of the ground level. Then, an NMOS transistor N71 in the discharge circuit 370 shown in FIG. 11 is turned off because it receives the discharge control signal dctr of the ground level at its gate.

In this manner, the discharge circuit 370 is in the turned-off state in the state before the semiconductor device enters the self-refresh mode.

Next, a description will be given of the operation of the voltage pumping device in the case where the semiconductor device enters the self-refresh mode. When the semiconductor device enters the self-refresh mode, the control signal SR is inputted to the first reference voltage generator 310 and the second reference voltage generator 350 under the condition that it is enabled to a high level.

Figure 8:
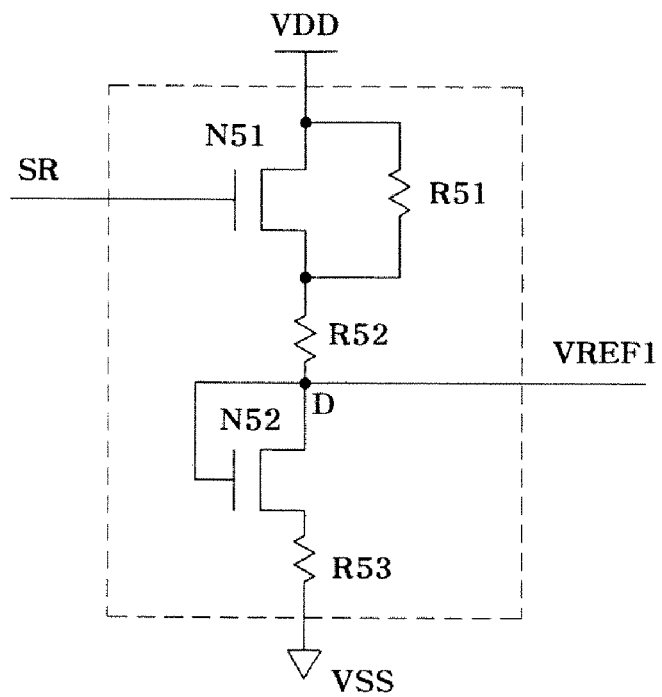
FIG. 8 is a circuit diagram of a first reference voltage generator in the voltage pumping device according to the second embodiment.

The first reference voltage generator 310 outputs the first reference voltage VREF1 of a higher level in response to the high-level control signal SR. That is, as shown in FIG. 8, when the inputted control signal SR assumes a high level, the NMOS transistor N51 is turned on. At this time, because the NMOS transistor N51 has a turn-on resistance much smaller than the resistance of the resistor R51, the voltage of the node D becomes higher than that resulting from the voltage division based on the resistor R51. Thus, the first reference voltage VREF I from the first reference voltage generator 310 in the self-refresh mode has a higher level than that before the entry into the self-refresh mode.

Then, the voltage level detector 320 and the voltage pump 330 cooperate to output the back bias voltage VBB of a second level higher than the first level in the same manner as before the entry into the self-refresh mode.

Conventionally, when the back bias voltage VBB rises to the second level in the self-refresh mode in the above manner, it rises very slowly at the beginning of the self-refresh mode, thus deteriorating refresh characteristics of the semiconductor device and causing a data error therein. In contrast, according to the second embodiment, the second reference voltage generator 350, the discharge controller 360 and the discharge circuit 370 cooperate to overcome such a problem, as will hereinafter be described in detail.

As shown in FIG. 9, when the control signal SR is enabled to a high level in the self-refresh mode, the NMOS transistor N55 is turned on in response to the control signal SR. Here, a resistor R56 has a resistance much smaller than that of an NMOS transistor N56. As a result, in the self-refresh mode, the second reference voltage VREF2 rises approximately to the threshold voltage Vt of the NMOS transistor N56.

Then, the discharge controller 360 receives the back bias voltage VBB together with the second reference voltage VREF2. First, in FIG. 10, because the second reference voltage VREF2 is substantially equal to the threshold voltage Vt of the NMOS transistor N56 as stated previously and a PMOS transistor P61 receives a ground voltage VSS at its gate, the PMOS transistor P61 is neither fully turned on nor turned off, but properly turned on.

At this time, if the absolute value of a gate-source voltage Vgs of a PMOS transistor P62 becomes larger than the absolute value of a threshold voltage of the PMOS transistor P62 as the back bias voltage VBB becomes lower than the second level, the PMOS transistor P62 is turned on more strongly than the PMOS transistor P61, thereby causing a larger amount of current to flow through the PMOS transistor P62. Thus, the voltage of a node F falls, so that a PMOS transistor P63 is turned on, thereby causing a signal at a node G to become high in level. Then, a buffer 362, which is composed of an inverter IV61 and an inverter IV62, buffers the signal at the node G and outputs the buffered signal as the discharge control signal dctr which is at a high level.

Subsequently, the high-level discharge control signal dctr turns on an NMOS transistor N71 of the discharge circuit 370 shown in FIG. 11, so as to pull a node A200 down to the ground level. Accordingly, the output terminal of the voltage pump 330, connected to the node A200, is discharged to the ground level. Therefore, according to the second embodiment, the back bias voltage VBB from the voltage pump 330 can rapidly rise to the second level by compulsorily discharging the output terminal of the voltage pump 330 as stated above, without needing to wait until the back bias voltage VBB rises due to natural current leakage in the voltage pumping device.

On the other hand, if the absolute value of the gate-source voltage Vgs of the PMOS transistor P62 becomes smaller than the absolute value of the threshold voltage of the PMOS transistor P62 as the back bias voltage VBB becomes higher than the second level, the PMOS transistor P62 is turned on more weakly than the PMOS transistor P61, thereby causing a smaller amount of current to flow through the PMOS transistor P62. Hence, the voltage of the node F rises, so that an NMOS transistor N61 is turned on, thereby causing the signal at the node G to become low in level. Then, the buffer 362 buffers the signal at the node G and outputs the buffered signal as the discharge control signal dctr which is at a low level. Thereafter, the low-level discharge control signal dctr turns off the NMOS transistor N71 of the discharge circuit 370 shown in FIG. 11, so as to stop discharging of the output terminal of the voltage pump 330.

Meanwhile, although the output terminal of the voltage pump 330 has been described to be discharged to the ground level as shown in FIG. 11, it may be discharged to any other level VDG as needed.

As described above, the voltage pumping device according to the second embodiment is capable of generating the back bias voltage VBB of the higher level in the self-refresh mode and, when the semiconductor device enters the self-refresh mode, discharging the output terminal of the voltage pump 330 to the desired voltage level, such as the ground level, so as to rapidly raise the back bias voltage to the desired level, or the higher level. Therefore, it is possible to improve the self-refresh characteristics of the semiconductor device.

Figure 12:
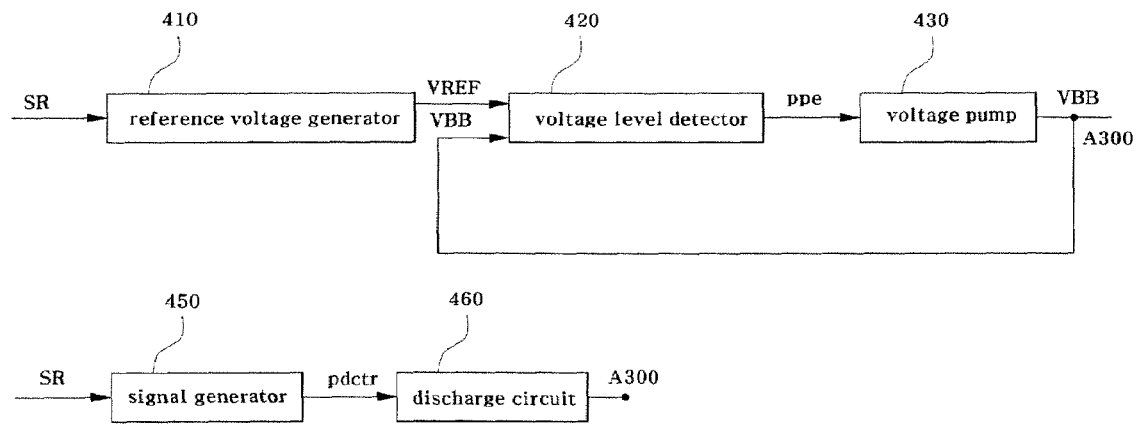
FIG. 12 is a block diagram showing the configuration of a voltage pumping device according to a third embodiment of the present invention.

FIG. 12 shows the configuration of a voltage pumping device according to a third embodiment of the present invention. A description will hereinafter be given of the voltage pumping device according to the third embodiment of the present invention with reference to FIG. 12.

As shown in FIG. 12, the voltage pumping device according to the third embodiment comprises a reference voltage generator 410 for generating a reference voltage VREF having different levels depending on whether a semiconductor device is in a self-refresh mode or not, a voltage level detector 420 for outputting a voltage pumping enabling signal ppe in response to the reference voltage VREF and a back bias voltage VBB fed back thereto, a voltage pump 430 for performing a voltage pumping operation in response to the voltage pumping enabling signal ppe to output the back bias voltage VBB, a signal generator 450 for outputting a discharge control signal pdctr which is enabled in a predetermined period in the self-refresh mode, and a discharge circuit 460 for discharging an output terminal of the voltage pump 430 to a desired voltage level in response to the discharge control signal pdctr.

Here, the reference voltage generator 410 is operated in response to a control signal SR which is enabled when the semiconductor device enters the self-refresh mode, and is adapted to output, in the self-refresh mode, the reference voltage VREF of a higher level than that in a non-self-refresh mode.

Figure 13:
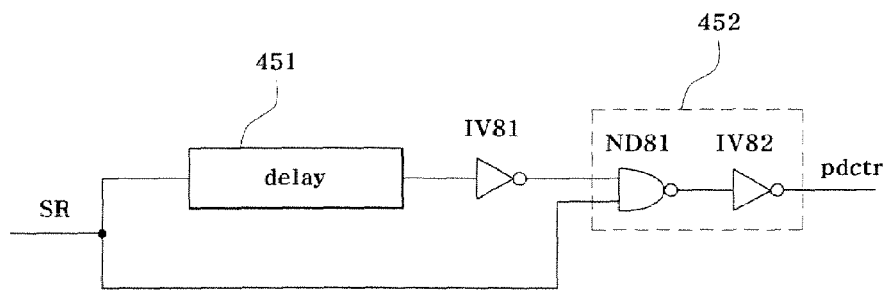
FIG. 13 is a circuit diagram of a signal generator in the voltage pumping device according to the third embodiment.

The operation of the voltage pumping device with the above-stated configuration according to the third embodiment will hereinafter be described in detail with reference to FIGS. 12 to 14.

The voltage pumping device according to the third embodiment has different operating mechanisms depending on whether the semiconductor device is in the self-refresh mode or not, and the operation thereof will thus be described in conjunction with respective operation modes.

The reference voltage generator 410, voltage level detector 420 and voltage pump 430 in the third embodiment are the same as the first reference voltage generator 310, voltage level detector 320 and voltage pump 330 in the second embodiment, respectively. Therefore, in the self-refresh mode, the voltage pump 430 in the third embodiment pumps the back bias voltage VBB to a higher level than that before the entry into the self-refresh mode in the same manner as in the second embodiment. However, the voltage pumping device according to the third embodiment discharges the output terminal of the voltage pump 430 to the desired voltage level in a different manner from that according to the second embodiment, as will hereinafter be described in detail.

First, a description will be given of the operation of the voltage pumping device in a state before the semiconductor device enters a self-refresh mode.

In the state before the semiconductor device enters the self-refresh mode, the control signal SR is inputted to the signal generator 450 under the condition that it is disabled to a low level. Here, the control signal SR is the same as those in the first and second embodiments.

When the inputted control signal SR is low in level, the signal generator 450 outputs the discharge control signal pdctr of a low level in response to the inputted control signal SR. That is, in the signal generator 450 shown in FIG. 13, a logic unit 452, which is composed of a NAND gate ND81 and an inverter IV82, receives the low-level control signal SR at its one input terminal and outputs the low-level discharge control signal pdctr, because it performs an AND operation. Then, an NMOS transistor N91 in the discharge circuit 460 shown in FIG. 14 is turned off because it receives a low-level discharge control signal pdctr at its gate. As a result, the discharge circuit 460 is in the turned-off state in the state before the semiconductor device enters the self-refresh mode.

Next, a description will be given of the operation of the voltage pumping device in the case where the semiconductor device enters the self-refresh mode. When the semiconductor device enters the self-refresh mode, the control signal SR is inputted to the signal generator 450 under the condition that it is enabled to a high level.

In response to the high-level control signal SR, the signal generator 450 outputs the discharge control signal pdctr which is enabled in the predetermined period. In detail, in FIG. 13, when the control signal SR still remains at a low level, an output signal from an inverter IV81 is high in level. Thereafter, if the control signal SR is enabled to a high level, the output signal from the inverter IV81 is continuously maintained at the previous level, or a high level, until a delay time of a delay 451 elapses. As a result, the logic unit 452 outputs the discharge control signal pdctr of a high level for the delay time of the delay 451 because it receives the high-level signals at both input terminals thereof for that delay time. Thereafter, if the delay time elapses, the output signal from the inverter IV81 makes a high to low level transition, thereby causing the discharge control signal pdctr from the logic unit 452 to be disabled to a low level. Consequently, when the semiconductor device enters the self-refresh mode, the signal generator 450 outputs the discharge control signal pdctr having the predetermined enabling period.

Figure 14:
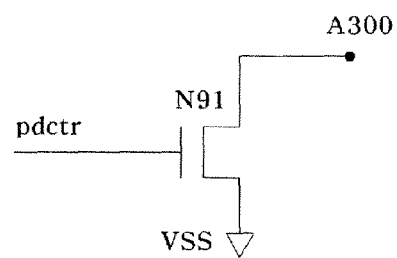
FIG. 14 is a circuit diagram of a discharge circuit in the voltage pumping device according to the third embodiment.

Subsequently, as shown in FIG. 14, an NMOS transistor N91 of the discharge circuit 460 is turned on for the predetermined enabling period because it receives the discharge control signal pdctr at its gate. As the NMOS transistor N91 is turned on, it pulls a node A300 down to the ground level. As a result, the output terminal of the voltage pump 430, connected to the node A300, is discharged to the ground level. Therefore, according to the third embodiment, the back bias voltage VBB from the voltage pump 430 can rapidly rise to the second level by compulsorily discharging the output terminal of the voltage pump 430 as stated above, without a need to wait until the back bias voltage VBB rises due to natural current leakage in the voltage pumping device.

Meanwhile, although the output terminal of the voltage pump 430 has been described to be discharged to the ground level as shown in FIG. 14, it may be discharged to any other level VDG as needed.

As described above, the voltage pumping device according to the third embodiment is capable of generating the back bias voltage VBB of the higher level in the self-refresh mode and, when the semiconductor device enters the self-refresh mode, discharging the output terminal of the voltage pump 430 to the desired voltage level, such as the ground level, so as to rapidly raise the back bias voltage to the desired level, or the higher level. Therefore, it is possible to improve the self-refresh characteristics of the semiconductor device.

As apparent from the above description, the present invention provides a voltage pumping device which is capable of generating a back bias voltage of a higher level in a self-refresh mode and, when a semiconductor device enters the self-refresh mode, discharging an output terminal of the voltage pumping device to a desired voltage level, such as a ground level, so as to rapidly raise the back bias voltage, thereby improving self-refresh characteristics of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A voltage pumping device comprising:
    a first reference voltage generator for generating a first reference voltage having different levels depending on whether a semiconductor device is in a self-refresh mode or not;
    a voltage level detector for outputting a voltage pumping enabling signal in response to the first reference voltage and a specific voltage fed back thereto;
    a voltage pump for performing a voltage pumping operation in response to the voltage pumping enabling signal to output the specific voltage;
    a signal generator for outputting a discharge control signal which is enabled in a predetermined period in the self-refresh mode; and
    a discharge circuit for discharging and output terminal of the voltage pump to a desired voltage level in response to the discharge control signal.

2. The voltage pumping device as set forth in claim 1, wherein the first reference voltage generator is operated in response to a control signal which is enabled when the semiconductor device enters the self-refresh mode, and outputs, in the self-refresh mode, the specific voltage of a higher level than that in a non-self-refresh mode.

3. The voltage pumping device as set forth in claim 2, wherein the first reference voltage generator includes:
    a pull-up device for pulling an output node of the first reference voltage generator up in response to the control signal;
    a first resistor connected between an input node of the pull-up device and an output node thereof; and
    a diode disposed between the output node of the first reference voltage generator and a ground terminal.

4. The voltage pumping device as set forth in claim 3, wherein the first reference voltage generator further includes:
    a second resistor disposed between the pull-up device and the output node of the first reference voltage generator; and
    a third resistor disposed between the diode and the ground terminal.

5. The voltage pumping device as set forth in claim 1, wherein the signal generator includes:
    a discharge controller for outputting a discharge control signal in response to the first reference voltage and the specific voltage.

6. The voltage pumping device as set forth in claim 5, wherein the discharge controller enables the discharge control signal when the specific voltage is lower than a certain voltage set according to the first reference voltage in the self-refresh mode.

7. The voltage pumping device as set forth in claim 6, wherein the discharge controller includes:
   a first pull-up device for pulling a first node up to a level of the first reference voltage;
   a first pull-down device for pulling the first node down in response to the specific voltage; and
   an inverter for inverting a signal at the first node and outputting the inverted signal node.

8. The voltage pumping device as set forth in claim 7, wherein the first pull-down device is a PMOS transistor.

9. The voltage pumping device as set forth in claim 1, wherein the discharge circuit includes a MOS transistor for discharging the output terminal of the voltage pump in response to the discharge control signal.

10. The voltage pumping device as set forth in claim 1, wherein the specific voltage is a back bias voltage.

11. The voltage pumping device as set forth in claim 1, wherein the signal generator includes:
   a second reference voltage generator for generating a second reference voltage which is enabled in the self-refresh mode;
   a discharge controller for outputting a discharge control signal in response to the second reference voltage and the specific voltage.

12. The voltage pumping device as set forth in claim 11, wherein the second reference voltage generator is operated in response to a control signal which is enabled when the semiconductor device enters the self-refresh mode.

13. The voltage pumping device as set forth in claim 12, wherein the second reference voltage generator includes:
   a pull-up device for pulling an output node of the second reference voltage generator up in response to the control signal; and
   a diode disposed between the output node of the second reference voltage generator and a ground terminal.

14. The voltage pumping device as set forth in claim 13, wherein the second reference voltage generator further includes:
   a first resistor disposed between the pull-up device and the output node of the second reference voltage generator; and
   a second resistor disposed between the diode and the ground terminal.

15. The voltage pumping device as set forth in claim 11, wherein the discharge controller is adapted to enable the discharge control signal when the specific voltage is lower than a certain voltage set according to the second reference voltage in the self-refresh mode.

16. The voltage pumping device as set forth in claim 15, wherein the discharge controller includes:
   a first pull-up device for pulling a first node up to a level of the second reference voltage;
   a first pull-down device for pulling the first node down in response to the specific voltage; and
   an inverter for inverting a signal at the first node and outputting the inverted signal to a second node.

17. The voltage pumping device as set forth in claim 16, wherein the inverter includes:
   a second pull-up device for pulling the second node up in response to the signal at the first node; and
   a second pull-down device for pulling the second node down in response to the signal at the first node.

18. The voltage pumping device as set forth in claim 16, wherein the first pull-up device is operated in response to the signal of a ground level.

19. The voltage pumping device as set forth in claim 1, wherein the signal is a pulse generator.

20. The voltage pumping device as set forth in claim 1, wherein the signal generator includes:
   a delay for delaying a control signal by the predetermined period, the control signal being enabled when the semiconductor device enters the self-refresh mode;
   a buffer for buffering an output signal from the delay; and
   a logic unit for performing a logic operation with respect to the output signal from the buffer and the control signal.

\* \* \* \* \*